United States Patent
Oner et al.

(10) Patent No.: US 8,098,788 B1
(45) Date of Patent: Jan. 17, 2012

(54) SYSTEM AND METHOD FOR AUTOMATIC LEAKAGE CONTROL CIRCUIT FOR CLOCK/DATA RECOVERY AND CHARGE-PUMP PHASE LOCKED LOOPS

(75) Inventors: Mustafa Ertugrul Oner, San Jose, CA (US); Arda Kamil Bafra, Istanbul (TR); Levent Yakay, Istanbul (TR)

(73) Assignee: Maxim Integrated Products, Inc., Sunnyvale, CA (US)

( * ) Notice: Subject to any disclaimer, the term of this patent is extended or adjusted under 35 U.S.C. 154(b) by 834 days.

(21) Appl. No.: 12/125,016

(22) Filed: May 21, 2008

(51) Int. Cl.
*H03D 3/24* (2006.01)
(52) U.S. Cl. .......... 375/376; 375/374; 375/375
(58) Field of Classification Search .......... 375/354, 375/371, 373, 374, 375, 376; 327/141, 144, 327/146, 147, 148, 155, 156, 157; 331/177 R, 331/1 R, 18, 25, 34
See application file for complete search history.

(56) References Cited

U.S. PATENT DOCUMENTS

| | | | |
|---|---|---|---|
| 6,466,096 B1 * | 10/2002 | DeVito | 331/11 |
| 6,717,475 B2 * | 4/2004 | McCarthy | 331/17 |
| 7,248,086 B2 * | 7/2007 | Frans et al. | 327/147 |
| 2005/0200391 A1 * | 9/2005 | Steinbach et al. | 327/156 |

* cited by examiner

*Primary Examiner* — David C. Payne
*Assistant Examiner* — Vineeta Panwalkar
(74) *Attorney, Agent, or Firm* — North Weber & Baugh LLP

(57) ABSTRACT

An apparatus that includes a module for controlling the frequency of a voltage controlled oscillator (VCO) as part of a phase locked loop (PLL), or clock and data recovery (CDR) when an input reference signal to the PLL or serial data to the CDR has ceased from being received. In particular, the apparatus comprises a VCO adapted to generate a VCO clock signal, a first control module adapted to control the frequency of the VCO clock signal based on the input reference signal, and a second control module adapted to control the frequency of the VCO clock signal in response to an absence of the input reference signal. By controlling the frequency of the VCO clock signal during an absence of the input reference signal, the first control module is able to more easily re-acquire control the frequency of the VCO clock signal when the input reference signal is received again.

18 Claims, 4 Drawing Sheets

SYSTEM AND METHOD FOR AUTOMATIC LEAKAGE CONTROL CIRCUIT FOR CLOCK/DATA RECOVERY AND CHARGE-PUMP PHASE LOCKED LOOPS

FIELD OF THE INVENTION

This invention relates generally to phase locked loop (PLL) circuits, and in particular, to a system and method for automatic leakage control circuit for clock/data recovery and charge-pump PLL circuits.

BACKGROUND OF THE INVENTION

In many applications, data is sent in a serial manner from a transmitting device to a receiving device. In order to properly receive the serial data, the receiving device typically needs timing information about when each datum, symbol or bit of the serial data is to be received. In some cases, the data is transmitted with an associated clock signal which provides the timing information needed for the receiving device to properly receive the data. However, in other cases, the serial data is delivered to the receiving device without a clock signal. In such cases, the receiving device needs to ascertain the timing information from the received data. An example of such a case is discussed as follows.

FIG. 1 illustrates a block diagram of a serializer/deserializer (Ser/Des) communication system 100. The Ser/Des communication system 100 includes a serializer 102 communicatively coupled to a deserializer 104. The serializer 102 typically includes a plurality of inputs to receive time-sensitive parallel data. The serializer 102 then multiplexes the parallel data to generate serial data. The serializer 102 then sends the serial data to the deserializer 104, which demultiplexes the serial data to recover the original parallel data.

As previously discussed, the serial data may not be sent with an associated clock signal which the deserializer 104 may use to properly receive the serial data. In such a case, the receiving device, in this case the deserializer 104, employs a clock recovery circuit that generates a clock signal timely associated with a special training pattern in the serial data so that the receiving device can properly extract the data. Often, the clock recovery circuit is configured as a phase locked loop (PLL) which generates a clock signal timely associated with the received serial data. An example of a clock recovery circuit is discussed as follows.

FIG. 2 illustrates a block diagram of an exemplary clock recovery circuit 200 that may be employed in the deserializer 104 of the Ser/Des communication system 100. The clock recovery circuit 200 includes a frequency detector 202, a charge pump 204, a low pass loop filter 206, a voltage controlled oscillator (VCO) 208, and a frequency divider 210. The frequency detector 202 receives the incoming serial data and the output of the frequency divider 210. The frequency detector 202 compares the frequencies of the two signals, and causes either a PD_UP or PD_DN control signal to go high in response to the error in frequency between the serial data and the output of the frequency divider 210. The frequency detector 202 causes either the PD_UP or PD_DN control signal to go high in order to minimize the error in frequency between the serial data and the output of the frequency divider 210.

If the frequency detector 202 causes the PD_UP signal to go high, the charge pump 204 generates a positive current going into the low pass loop filter 206. The low pass loop filter 206 integrates the current from the charge pump 204 to increase the control voltage VCON for the VCO 208. This, in turn, causes the frequency of the clock signal generated by the VCO 208 to increase, which also causes the frequency of the output of the frequency divider 210 to increase. On the other hand, if the frequency detector 202 causes the PD_DN signal to go high, the charge pump 204 generates a negative current that removes charges from the loop filter 206. This has the effect of lowering the VCO control voltage VCON. This, in turn, causes the frequency of the clock signal generated by the VCO 208 to decrease, which also causes the frequency of the output of the frequency divider 210 to decrease.

Once the clock recovery circuit 200 recovers the clock signal, the mode of the circuit is changed to a data recovery. As discussed in more detail below, in data recovery mode, the phase of the clock signal generated by the VCO 208 is modified to ensure a proper recovery of the incoming serial data. If the incoming serial data ceases, there is no more timing information being received to keep the frequency of the clock signal in synchronous with the incoming data. For instance, the data may discontinue during a vertical or horizontal blanking period of a video signal. Due to current leakage at the VCO control node, which may be caused by reverse junction current leakage, the VCO control voltage VCON may tend to drift. This causes the frequency of the VCO clock signal to drift. The drift may be so substantial that when data is received again, the data recovery operation may not work properly, and a whole new process of re-acquiring the clock needs to be implemented.

SUMMARY OF THE INVENTION

An aspect of the invention relates to an apparatus that includes a module for controlling the frequency of a voltage controlled oscillator (VCO) as part of a clock and data recovery (CDR) circuit when an input reference signal, such as serial data, has ceased from being received. In particular, the apparatus comprises a VCO adapted to generate a VCO clock signal, a first control module adapted to control the frequency of the VCO clock signal based on the input reference signal, and a second control module adapted to control the frequency of the VCO clock signal in response to an absence of the input reference signal. By controlling the frequency of the VCO clock signal during an absence of the input reference signal, the first control module may be allowed to more easily re-control the frequency of the VCO clock signal when the input reference signal begins to be received again. In particular, the second control module holds the VCO frequency within the pull-in range of the first control module until the next time the serial data appears.

In another aspect of the invention, the second control module maintains the frequency of the VCO clock signal substantially constant when the input reference signal has ceased from being received. In yet another aspect, the second control module maintains the frequency of the VCO clock signal substantially the same as the frequency of the VCO clock signal during the time when the first control module controls the frequency of the VCO clock signal.

In yet another aspect of the invention, the second control module comprises a charge pump adapted to supply or remove current to and from the frequency control node of the VCO, a reference oscillator adapted to generate a reference clock signal, and a controller adapted to control the charge pump in response to the reference clock signal and the VCO clock signal. In a more specific embodiment, the controller is adapted to generate and store a first value based on a first comparison of the frequency of the reference clock signal to the frequency of the VCO clock signal; generate a second value based on a second comparison of the frequency of the reference clock signal to the frequency of the VCO clock signal; and generate a control signal for controlling the frequency of the VCO clock signal in response to a comparison of the first value to the second value.

In another aspect of the invention, the control signal generated by the controller causes the frequency of the VCO clock signal to increase if the comparison of the first and second values indicates that the frequency of the VCO clock signal has decreased. Similarly, the control signal generated by the controller causes the frequency of the VCO clock signal to decrease if the comparison of the first and second values indicates that the frequency of the VCO clock signal has increased or remained substantially the same.

In another aspect of the invention, the controller comprises a first counter adapted to generate a first signal including at least a portion having a length dependent on the frequency of the VCO clock signal during a first measurement thereof, and generate a second signal including at least a portion having a length dependent on the frequency of the VCO clock signal during a second measurement thereof. The controller further comprises a second counter adapted to generate a first value related to a number of cycles of the reference clock signal generated within the at least portion of the first signal, and generate a second value related to a number of cycles of the reference clock signal generated within the at least portion of the second signal. Also, the controller comprises a register to store the first value. Additionally, the controller comprises a signal generator adapted to generate a first frequency control signal in response to the first value being greater than the second value, and generate a second frequency control signal in response to the first value being less than the second value.

Other aspects, advantages and novel features of the present invention will become apparent from the following detailed description of the invention when considered in conjunction with the accompanying drawings.

DETAILED DESCRIPTION OF THE EXEMPLARY EMBODIMENTS

Figure 1:
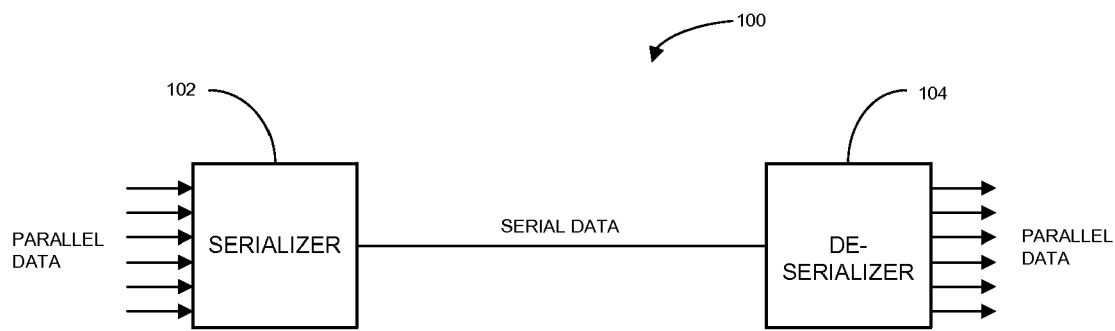
FIG. 1 illustrates a block diagram of a serializer/deserializer (Ser/Des) communication system.
Figure 2:
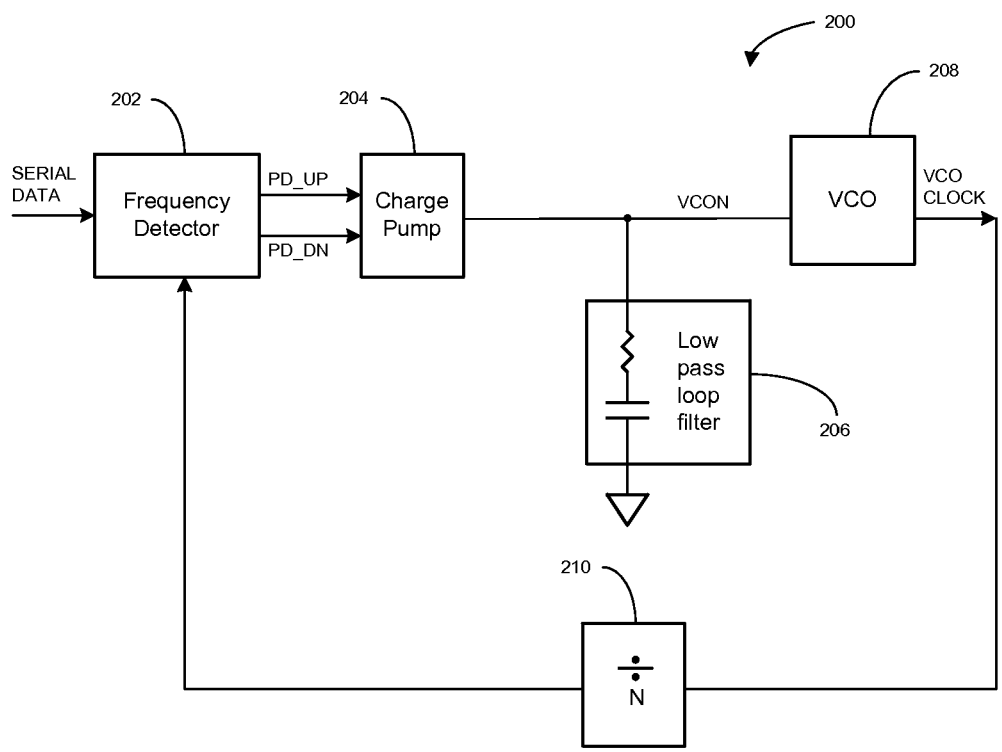
FIG. 2 illustrates a block diagram of a clock recovery circuit used in the Ser/Des communication system.
Figure 3:
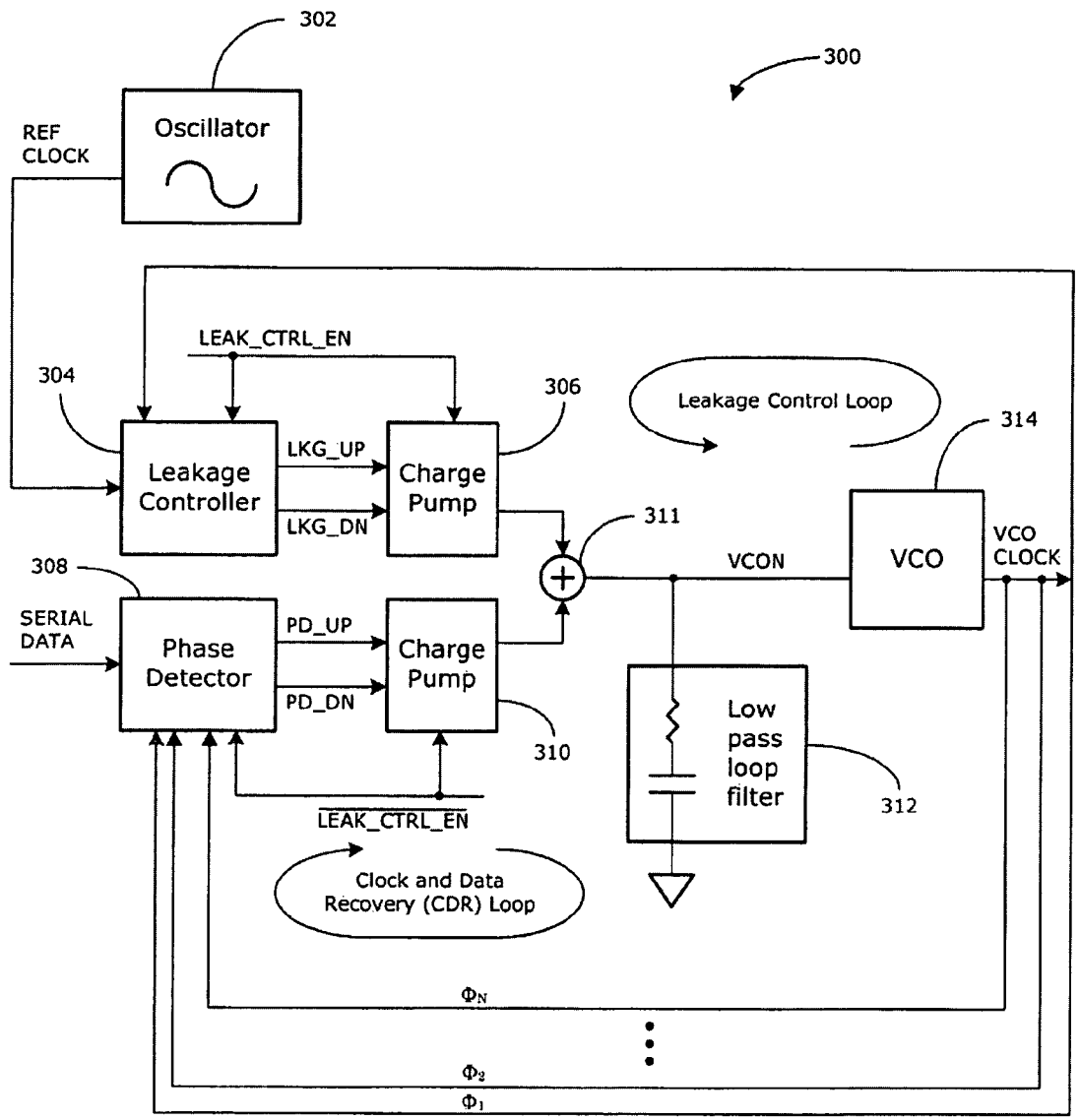
FIG. 3 illustrates a block diagram of an exemplary clock and data recovery (CDR) circuit including a leakage control module in accordance with an embodiment of the invention.

FIG. 3 illustrates a block diagram of an exemplary clock and data recovery (CDR) circuit 300 including a CDR module and a leakage control module in accordance with an embodiment of the invention. In summary, the CDR control module controls a voltage controlled oscillator (VCO) to generate a clock signal having a phase relationship that substantially correlates with an incoming serial data for the purpose of extracting or recovering the data. When the serial data ceases to be received by the CDR module, the leakage control module controls the VCO to maintain the frequency of the VCO clock signal substantially constant and within the pull-in range of the CDR module the next time the serial data appears. This allows the CDR module to more easily establish a VCO clock signal with a phase relationship with the incoming serial data once it is received again.

In particular, the CDR circuit 300 comprises a current adder 311, a low pass loop filter 312, and a voltage controlled oscillator (VCO) 314. The CDR circuit 300 further comprises a clock and data recovery (CDR) module that includes a phase detector 308 and a charge pump 310. Additionally, the CDR circuit 300 comprises a leakage control module that includes a reference oscillator 302, a leakage controller 304, and a charge pump 306. As previously discussed, the CDR module generates a control current for controlling the VCO 314 so that it generates a clock signal that has a timing relationship that substantially correlates with the incoming serial data. In response to the absence of the incoming serial data, the leakage control module generates a control current for controlling the VCO 314 so that it generates a clock signal with a substantially constant frequency and a frequency that is within the pull-in range of the CDR module the next time the data is received again.

More specifically, the phase detector 308 includes a first input adapted to receive the incoming serial data. The phase detector 308 further includes a second input adapted to receive one or more outputs of the VCO 314 with distinct phases $\Phi_1$-$\Phi_N$. The phase detector 308 compares the transitions of the serial data and the different phases $\Phi_1$-$\Phi_N$ of the VCO 314 outputs, and generates either a PD_UP or PD_DN control signal in response to early/late information between the serial data and the one or more output(s) of the VCO 314. The phase detector 308 produces the PD_UP and PD_DN control signals in order to minimize the phase error between the serial data and the output(s) of the VCO 314.

For instance, if the edge(s) of the output(s) of the VCO 314 is late with respect to the serial data, the phase detector 308 generates the PD_UP signal. In response to the PD_UP signal, the charge pump 310 generates a positive current to the loop filter 312 via the adder 311. The low pass loop filter 312 integrates this additional current to increase the control voltage VCON for the VCO 314. Thus, the increase in the VCO control voltage VCON causes an increase in the frequency of the clock signal generated by the VCO 314. This, in effect, reduces the lag in phase of the output(s) of the VCO 314 with respect to the serial data, in order to maintain the specified phase relationship between the VCO clock signal and the serial data for the purpose of extracting the data.

Similarly, if the edge(s) of the output(s) of the VCO 314 is early with respect to the serial data, the phase detector 308 generates the PD_DN signal. In response to the PD_DN signal, the charge pump 310 generates a negative current to remove charges from the loop filter 312. The decrease in the charges causes the VCO control voltage VCON to decrease, thereby decreasing the frequency of the clock signal generated by the VCO 314. This, in effect, reduces the phase difference between the output(s) of the VCO 314 and the serial data, in order to maintain the specified phase relationship between the VCO clock signal and the serial data for the purpose of extracting the data. While the serial data is being received, the leakage control module is disabled.

If the serial data ceases from being received, the phase detector 308 ceases generating the PD_UP and PD_DN signals because there are no more "data" edges to compare with the output(s) of the VCO 314. Accordingly, the VCO control voltage does not receive anymore updates from the CDR module, and is subject to drift due to current leakage or other factors. Thus, when the serial data ceases, the leakage control module takes control of the VCO 314 from the CDR module. As previously discussed, the leakage control module maintains the frequency of the clock signal generated by the VCO 314 at the same frequency of the VCO clock signal prior to the serial data ceasing to be received, or within the pull-in range of the CDR module when the serial data is received again. In this manner, when the serial data is received again, the CDR section is able to more easily lock to the phase of the serial data, thereby maintaining the phase relationship between the VCO clock signal and the serial data. Because the VCO control voltage has a tendency to decrease due to reverse junction current leakage through various devices, the leakage control module monitors the frequency of the VCO clock signal and applies correction to maintain the frequency of the VCO clock signal substantially constant.

In particular, when the serial data ceases to be received, the Leak_CTRL_EN signal becomes logically high to enable the leakage controller 304 and the charge pump 306. At the same time, the complimentary Leak_CTRL_EN signal becomes logically low to disable the phase detector 308 and the charge pump 310. In this mode, the leakage controller 304 compares the frequency of the VCO clock signal with the frequency of the reference clock signal generated by the oscillator 302. As discussed in more detail below, the first time the leakage controller 304 compares the frequencies, it merely notes or stores it as a reference comparison. Then, in each subsequent measurement cycle, the leakage controller 304 generates a new comparison between the frequency of the VCO clock signal and the reference clock signal. The controller then compares the new comparison with the reference comparison to determine whether the frequency of the VCO clock signal has changed.

If the leakage controller 304 detects that the frequency of the clock signal increased, the leakage controller sends a LKG_DN signal to the charge pump 306. In response, the charge pump 306 generates a negative current to remove charges from the loop filter 312 so as to lower the VCO control voltage VCON. The lower VCO control voltage, in turn, results in a lower frequency of the VCO clock signal. This action may bring the frequency of the VCO clock signal to within an acceptable tolerance of the frequency of the VCO clock signal at the time of the first measurement.

Similarly, if the leakage controller 304 detects that the frequency of the clock signal decreased, the leakage controller sends a LKG_UP signal to the charge pump 306. In response, the charge pump 306 generates a positive current to add charges to the loop filter 312 so as to increase the VCO control voltage VCON. The higher VCO control voltage VCON, in turn, results in a higher frequency of the VCO clock signal. This action may bring the frequency of the VCO clock signal to within an acceptable tolerance of the frequency of the VCO clock signal at the time of the first measurement.

If the leakage controller 304 detects that the frequency of the clock signal has not changed, the leakage controller may send a LKG_UP signal to the charge pump 306. In response, the charge pump 306 generates a positive current to send charges to the loop filter 312 so as to increase the VCO control voltage VCON. The higher VCO control voltage VCO, in turn, results in a higher frequency of the VCO clock signal. This action may force the frequency of the VCO clock signal above the acceptable tolerance of the frequency of the VCO clock signal at the time of the first measurement. Since it is predicted that the frequency of the VCO clock signal will most likely decrease due to reverse junction current leakage at the VCO control node, adjusting the frequency of the VCO above the accepted tolerance if the leakage controller 304 detects no change in the frequency causes the frequency of the VCO clock signal to ripple around the desired frequency. The leakage control module repeatedly measures and corrects the frequency of the VCO clock signal so long as the serial data is not being received. The following describes a more detailed embodiment of a leakage controller.

Figure 4:
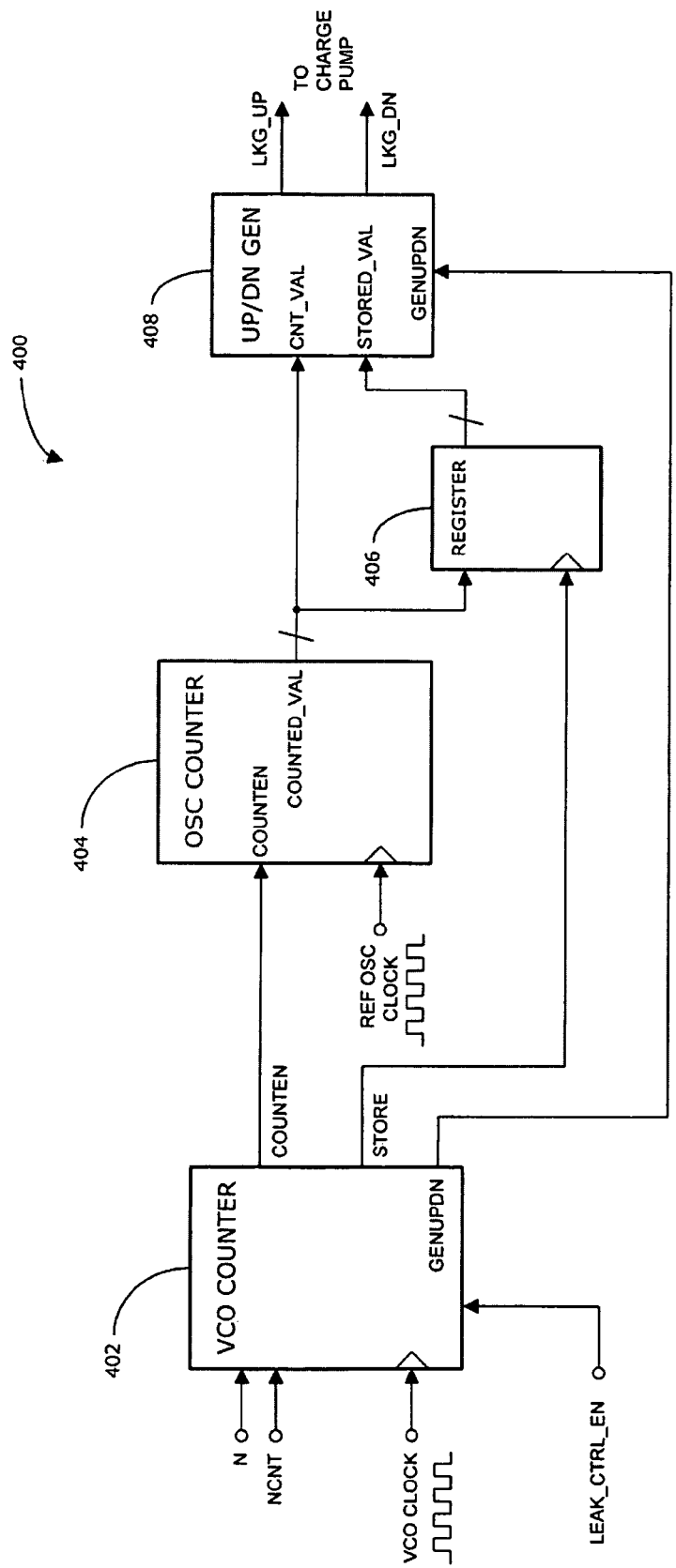
FIG. 4 illustrates a block diagram of an exemplary leakage control module in accordance with another embodiment of the invention.

FIG. 4 illustrates a block diagram of an exemplary leakage controller 400 in accordance with another embodiment of the invention. The leakage controller 400 is merely one exemplary detailed implementation of the leakage controller 304. As previously discussed, in response to the serial data ceasing to be received, the leakage controller 400 performs a first comparison of the frequency of the VCO clock signal with the frequency of the reference oscillator signal. The leakage controller 400 stores the first comparison as a reference comparison. The leakage controller 400 then performs subsequent comparisons of the frequency of the VCO clock signal with the frequency of the reference oscillator. By comparing the subsequent comparisons with the reference comparison, the leakage controller 400 is able to detect whether the frequency of the VCO signal has increased, decreased, or remained substantially the same.

If the leakage controller 400 detects that the frequency has increased with respect to the first measurement, it sends a LKG_DN to the charge pump to decrease the frequency of the VCO clock signal. If the leakage controller 400 detects that the frequency has decreased with respect to the first measurement, it sends a LKG_UP to the charge pump to increase the frequency of the VCO clock signal. If the leakage controller 400 detects that the frequency has remained substantially the same with respect to the first measurement, it sends a LKG_UP to the charge pump to increase the frequency of the VCO clock signal. In this manner, the leakage controller 400 maintains the frequency of the VCO clock signal rippling about the desired frequency.

More specifically, the leakage controller 400 comprises a VCO counter 402, an OSC counter 404, a register 406, and an UP/DN generator 408. The VCO counter 402 includes an input to receive "N" which specifies the period of the COUNTEN signal in terms of the number of VCO clock periods, and may be represented as follows:

$$\text{COUNTEN (period)} = N * \text{VCO (period)} \qquad \text{Eq. 1}$$

The VCO counter 402 further includes an input to receive "NCNT" which specifies how long the COUNTEN signal is at a logically high state within its period in terms of the number of VCO clock periods, and may be represented as follows:

$$\text{COUNTEN (high)} = NCNT * \text{VCO (period)} \qquad \text{Eq. 2}$$

The VCO counter 402 further includes an input to receive the VCO clock signal, and an input to receive the control signal LEAK_CTRL_EN for enabling and disabling the VCO counter 402.

The VCO counter 402 further includes an output to produce the COUNTEN periodic signal as discussed above. The VCO counter 402 further includes an output to generate a STORE signal to cause the register 406 to store the value of COUNTED_VAL from the output of the OSC counter 404. And, the VCO counter 402 further includes an output to generate the GENUPDN signal that triggers the UP/DN generator 408 to generate either an LKG_UP or LKG_DN signal depending upon whether the value of STORED_VAL is higher or lower than the value of CNT_VAL.

The OSC counter 404 includes an input to receive the COUNTEN signal from the VCO counter 402. The OSC counter 404 also includes an input to receive the reference clock signal from the reference oscillator. The OSC counter 404 includes an output to generate the COUNTED_VAL signal, which indicates a value related to a comparison of the frequency of the VCO clock signal with the frequency of the reference clock signal. In particular, the OSC counter 404 counts with the reference clock signal when the COUNTEN signal is high.

The register 406 includes a data input to receive and store the COUNTED_VAL from the OSC counter 404. The register 406 further includes a clock input to receive the STORE signal from the VCO counter 402. The register 406 also includes a data output to produce the stored COUNTED_VAL. As discussed in more detail below, when the leakage controller 400 is first enabled, the first measurement of the COUNTED_VAL is stored in the register 406. All other measurements of the COUNTED_VAL are compared with the STORED_VAL to determine whether the frequency of the VCO clock signal has changed from the time of the first measurement.

The UP/DN generator 408 includes a CNT_VAL input to receive the COUNTED_VAL signal from the OSC counter 404, a STORED_VAL input to receive the STORED_VAL from the register 406, and a trigger input to receive the GENUPDN from the VCO Counter 402. The UP/DN generator 408 includes a first output to generate a LKG_UP signal that causes the charge pump to generate a positive current, and a second output to generate a LKG_DN signal that causes the charge pump to generate a negative current. The following explains the operation of the leakage controller 400.

Figure 5:
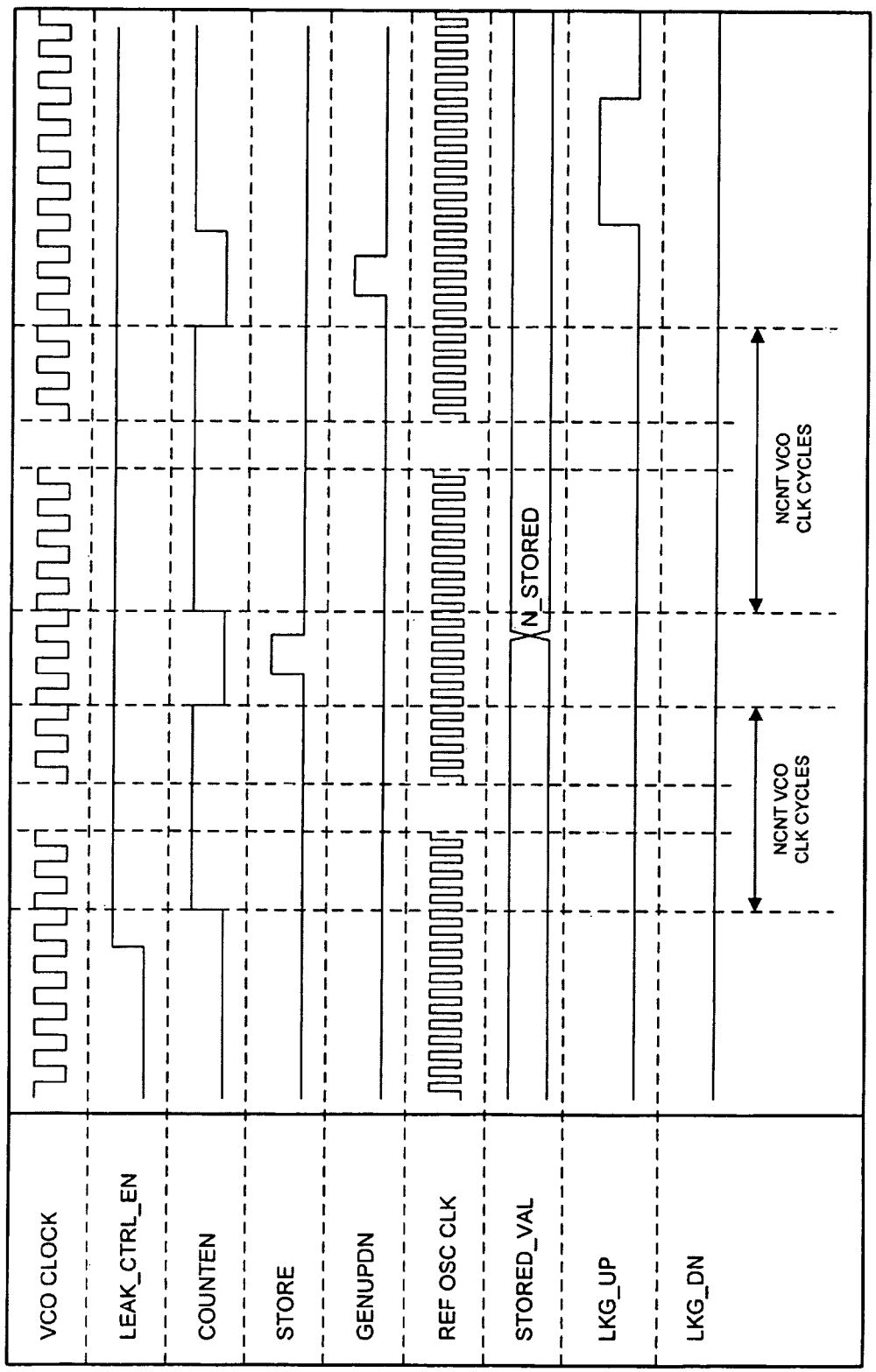
FIG. 5 illustrates a timing diagram of exemplary signals generated within the exemplary leakage control module in accordance with another embodiment of the invention.

FIG. 5 illustrates a timing diagram of exemplary signals generated within the exemplary leakage control circuit 400 in accordance with another embodiment of the invention. When it is first detected that the incoming serial data is no longer being received, the LEAK_CTRL_EN signal transitions from a low logic level to a high logic level. This enables the VCO counter 402. A period of the VCO clock signal after the LEAK_CTRL_EN signal transitions to a high logic level, the COUNTEN signal transitions from a low logic level to a high logic level. The COUNTEN signal remains at the high logic level for a time of NCNT*VCO (period), as per Eq. 2 discussed above.

The oscillator counter 404 starts counting the periods of the reference oscillator signal when the COUNTEN signal transitions to a high logic level, and stops counting when the COUNTEN signal transitions to a low logic level. The COUNTED_VAL signal indicates the value of the count. A period of the VCO clock signal after the COUNTEN signal transitions to the logic low level, the VCO counter 402 generates the STORE signal. This causes the register 406 to read and store the COUNTED_VAL generated by the OSC counter 404. The stored COUNTED_VAL, referred to herein as STORED_VAL, is inversely related to the frequency of the VCO clock signal at the time of the first measurement, and may be represented as follows:

$$STORED\_VAL = NCNT*(F_{REF}/F_{VCO1}) \qquad Eq. 3$$

Where, as discussed above, the NCNT is the time that the COUNTEN signal is at the high logic level during a period of the COUNTEN signal, $F_{REF}$ is the frequency of the reference clock signal, and the $F_{VCO1}$ is the frequency of the VCO clock signal at the time of the first measurement.

The COUNTEN signal remains at the low logic level for the rest of the period of the COUNTEN signal (e.g., for a time equal to (N−NCNT*VCO clock period)). Prior to the second measurement cycle, the OSC counter 404 resets the COUNTED_VAL back to zero (0). The second measurement cycle begins when the COUNTEN signal transitions again from the low logic level to the high logic level. The oscillator counter 404 starts counting the periods of the reference oscillator when the COUNTEN signal transitions to a high logic level, and stops counting when the COUNTEN signal transitions to a low logic level.

A period of the VCO clock signal after the COUNTEN signal transitions to the logic low level, the VCO counter 402 generates the GENUPDN signal. This causes the UP/DN generator 408 to compare the COUNTED_VAL with the STORED_VAL, and generate a LKG_UP or a LKG_DN based on the comparison. The COUNTED_VAL is inversely related to the frequency of the VCO clock signal at the time of the second measurement, and may be represented as follows:

$$COUNTED\_VAL = NCNT*(F_{REF}/F_{VCO2}) \qquad Eq. 4$$

Where, as discussed above, the NCNT is the time that the COUNTEN signal is at the high logic level during a period of the COUNTEN signal, $F_{REF}$ is the frequency of the reference clock signal, and the $F_{VCO2}$ is the frequency of the VCO clock signal at the time of the second measurement.

Thus, the UP/DN generator 408 produces the LKG_UP signal if the COUNTED_VAL>STORED_VAL. This means that $F_{VCO2}$ is less than $F_{VCO1}$, which indicates that the frequency of the VCO clock signal has decreased from the time of the first measurement. The UP/DN generator 408 produces the LKG_UP signal to bring up the frequency of the VCO clock signal to correct for the decreased in frequency, which was probably due to reverse junction current leakage in the control node of the VCO. In the example shown in the timing diagram of FIG. 5, the UP/DN generator 408 generated the LKG_UP signal because of a decrease in the frequency of the VCO clock signal.

If, on the other hand, the COUNTED_VAL was less than the STORED_VAL, the UP/DN generator 408 would produce the LKG_DN signal because $F_{VCO2}$ is greater than $F_{VCO1}$. This causes the frequency of the VCO clock signal to decrease to correct for the increase in the VCO signal frequency. If the COUNTED_VAL was the same as the STORED_VAL, the UP/DN generator 408 may be configured to generate the LKG_UP signal. This is because the frequency of the VCO clock signal typically has more of a tendency to decrease than to increase. By generating the LKG_UP signal when the COUNTED_VAL and the STORED_VAL are the same, the frequency of the VCO clock signal could be controlled to ripple about its desired value.

In general, for all subsequent measurement cycles, the UP/DN generator 408 may be programmed to generate the following:

LKG_UP when COUNTED_VAL(k)≧STORED_VAL

LKG_DN when COUNTED_VAL(k)<STORED_VAL where COUNTED_VAL(k) is the output of the OSC counter 404 at the end of the kth measurement cycle.

In the leakage controller 400, there are at least three (3) parameters that can be adjusted to control the frequency of the VCO clock signal. The first parameter is the minimum amount of frequency deviation in the VCO clock signal that would prompt a correction in the frequency by the leakage controller 400 (e.g., the resolution of the controller). The second parameter is the amount of correction that occurs per measurement cycle. And, the third parameter is the frequency of the measurement cycles.

The first parameter relating to the minimum amount of frequency deviation that would prompt depends on the frequencies of the VCO clock signal and the reference oscillator signal. In particular, the minimum detectable frequency change ΔFvco may be represented as follows:

$$\Delta Fvco/Fvco = Tosc/(N*Tvco) \quad \text{Eq. 5}$$

Where Fvco is the frequency of the VCO clock signal, Tosc is the period of the reference oscillator signal, N is the period of the COUNTEN signal in terms of the number of VCO clock periods, and Tvco is the period of the VCO clock signal. As Eq. 5 indicates, to increase the resolution (e.g., minimize the minimum frequency change that prompts a correction), N and/or the frequency of the reference oscillator may be increased.

The second parameter relating to the amount of correction that occurs per each measurement cycle depends on several factors and may be based on the premise that the amount of charge transferred by LKG_UP pulse should compensate for charge leakage that may occur in the VCO control node between successive measurement cycles. For instance, the amount of charge Qcomp transferred by a LKG_UP or LKG_DN pulse may be represented as follows:

$$Qcomp = k \times Tosc \times Icp \quad \text{Eq. 6}$$

Where k is the length of the LKG_UP pulse in terms of reference clock periods, Tosc is the minimum reference clock period, and Icp is the minimum charge pump current. The amount of charge leakage Qleak that may occur between successive measurement cycles may be represented as follows:

$$Qleak = N \times Tvco \times Ileak \quad \text{Eq. 7}$$

Where N is the maximum number of VCO clock cycles in a measurement cycle, Tvco is the maximum period of the VCO clock signal, and Ileak is the maximum leakage current. Thus, to properly compensate for charge leakage in the VCO control node, Qcomp should be greater than or equal to Qleak. This means that the maximum correctable current leakage in the VCO control node may be represented as follows:

$$Ileak < k \times Tosc \times Icp / N \times Tvco \quad \text{Eq. 8}$$

Thus, by adjusting or properly selecting of the reference oscillator frequency (1/Tosc) and the period of the COUNTEN signal (N×Tvco), the leakage controller 400 may be configured to properly compensate for current leakage occurring in the VCO control node.

The third parameter relating to the frequency of the measurement cycles (N×Tvco) affect both the minimum detectable frequency change and the required amount of charges needed to accurately compensate for current leakage in the VCO control node. As N is increased, the resolution of the frequency adjustment increases because the minimum detectable frequency change gets smaller. However, as N increases, the amount of charges needed to correct for current leakage in the VCO node increases. Thus, N should be selected according to the particular characteristics of the CDR module and the desired frequency resolution.

While the invention has been described in connection with various embodiments, it will be understood that the invention is capable of further modifications. This application is intended to cover any variations, uses or adaptation of the invention following, in general, the principles of the invention, and including such departures from the present disclosure as come within the known and customary practice within the art to which the invention pertains.

What is claimed is:

1. An apparatus, comprising:
    a voltage controlled oscillator (VCO) adapted to generate a VCO clock signal;
    a first control module adapted to control a frequency of the VCO clock signal based on an input signal;
    a second control module adapted to control the frequency of the VCO clock signal in response to an absence of the input signal; and
    an input signal detection circuit adapted to enable the first control module and disable the second control module when the input signal is detected, and to disable the first control module and enable the second control module when the absence of the input signal is detected.

2. The apparatus of claim 1, wherein the second control module is adapted to maintain the frequency of the VCO clock signal substantially constant.

3. The apparatus of claim 2, wherein the second control module is adapted to maintain the frequency of the clock signal within a pull-in range of the first control module when the input signal is received again.

4. The apparatus of claim 1, wherein the second control module comprises:
    a charge pump adapted to generate a positive current or a negative current with respect to a frequency control node of the VCO;
    a reference oscillator adapted to generate a reference clock signal; and
    a controller adapted to control the charge pump in response to the reference clock signal and the VCO clock signal.

5. The apparatus of claim 4, wherein the controller is adapted to:
    generate and store a first value based on a first comparison between a frequency of the reference clock signal and the frequency of the VCO clock signal;
    generate a second value based on a second comparison between the frequency of the reference clock signal and the frequency of the VCO clock signal; and
    generate a control signal for controlling the frequency of the VCO clock signal based on a comparison of the first and second values.

6. The apparatus of claim 5, wherein the control signal causes the frequency of the VCO clock signal to increase if the comparison of the first and second values indicates that the frequency of the VCO clock signal has decreased between the first and second comparisons.

7. The apparatus of claim 5, wherein the control signal causes the frequency of the VCO clock signal to decrease if the comparison of the first and second values indicates that the frequency of the VCO clock signal has increased or has not substantially changed between the first and second comparisons.

8. The apparatus of claim 4, wherein the controller comprises:
    a first counter adapted to:
        generate a first signal including at least a portion having a length dependent on the frequency of the VCO clock signal during a first measurement; and
        generate a second signal including at least a portion having a length dependent on the frequency of the VCO clock signal during a second measurement;
    a second counter adapted to:
        generate a first value related to a number of cycles of the reference clock signal generated within the at least portion of the first signal; and
        generate a second value related to a number of cycles of the reference clock signal generated within the at least portion of the second signal;
    a register to store the first value; and a signal generator adapted to:
  generate a first frequency control signal in response to the first value being greater than the second value; and
  generate a second frequency control signal in response to the first value being less than the second value.

9. The apparatus of claim 1, wherein the input signal comprises a serial data.

10. The apparatus of claim 1, wherein the first control module comprises:
  a charge pump adapted to generate a positive current or negative current with respect to a frequency control node of the VCO; and
  a phase detector adapted to control the charge pump in response to a phase difference between the input signal and the VCO clock signal.

11. A method of controlling a frequency of a signal generated by a voltage controlled oscillator (VCO), comprising:
  determining whether the input signal is present;
  selecting a control module, wherein
    when the input signal is detected, a first control module is enabled, and a second control module is disabled;
    when the absence of the input signal is detected, the first control module is disabled and the second control module is enabled;
  controlling the frequency of the signal generated by the VCO using the first control module based on an input signal; and
  controlling the frequency of the signal generated by the VCO using the second control module in response to an absence of the input signal.

12. The method of claim 11, wherein controlling the frequency of the signal generated by the VCO in response to the absence of the input signal comprises maintaining the frequency of the VCO clock signal substantially constant.

13. The method of claim 12, wherein controlling the frequency of the signal generated by the VCO in response to the absence of the input signal comprises maintaining the frequency of the VCO clock signal within a specified frequency range.

14. The method of claim 11, wherein controlling the frequency of the signal generated by the VCO in response to the absence of the input signal comprises:
  generating a first value related to a comparison of the frequency of the VCO signal with a frequency of a reference oscillator at a time of a first measurement;
  generating a second value related to a comparison of the frequency of the VCO signal with a frequency of a reference oscillator at a time of a second measurement;
  comparing the first value to the second value; and
  sending a control signal to the VCO based on the comparison of the first value to the second value.

15. The method of claim 11, wherein the input signal comprises a serial data.

16. The method of claim 11, wherein controlling the frequency of the signal generated by the VCO in response to the input signal comprises:
  comparing a phase of the input signal with a phase of the signal generated by the VCO; and
  adjusting the frequency of the signal generated by the VCO such that the difference between the phase of the input signal and the phase of the signal generated by the VCO is substantially nil.

17. A clock and data recovery (CDR) apparatus, comprising:
  a voltage controlled oscillator (VCO) adapted to generate a clock signal;
  a first control module adapted to control a frequency and a phase of the clock signal so that a frequency and phase relationship exists between an input data and the clock signal;
  a second control module adapted to control the frequency of the VCO clock signal in response to an absence of the input signal; and
  an input signal detection circuit adapted to enable the first control module and disable the second control module when the input signal is detected, and to disable the first control module and enable the second control module when the absence of the input signal is detected.

18. The CDR apparatus of claim 17, wherein the second control module is adapted to maintain the frequency of the clock signal substantially constant and within a pull-in range of the first control module.

* * * * *